(12) United States Patent
Li et al.

(10) Patent No.: US 11,791,299 B2
(45) Date of Patent: Oct. 17, 2023

(54) REDISTRIBUTION LAYER (RDL) LAYOUTS FOR INTEGRATED CIRCUITS

(71) Applicant: Taiwan Semiconductor Manufacturing Co., Ltd., Hsinchu (TW)

(72) Inventors: Cheng-Yuan Li, Kaohsiung (TW); Kuo-Cheng Lee, Tainan (TW); Yun-Wei Cheng, Taipei (TW); Yen-Liang Lin, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 139 days.

(21) Appl. No.: 15/965,116

(22) Filed: Apr. 27, 2018

(65) Prior Publication Data

US 2019/0164924 A1    May 30, 2019

Related U.S. Application Data

(60) Provisional application No. 62/592,701, filed on Nov. 30, 2017.

(51) Int. Cl.
*H01L 23/00* (2006.01)

(52) U.S. Cl.
CPC .............. *H01L 24/20* (2013.01); *H01L 24/24* (2013.01); *H01L 24/82* (2013.01); *H01L 2224/2105* (2013.01); *H01L 2224/24145* (2013.01); *H01L 2224/8212* (2013.01); *H01L 2224/82896* (2013.01)

(58) Field of Classification Search
CPC ..... H01L 24/20; H01L 24/24; H01L 23/5389; H01L 24/82; H01L 2224/211; H01L 2224/24145; H01L 2224/82896
USPC .......................... 257/773; 438/455, 598, 622
See application file for complete search history.

(56) References Cited

U.S. PATENT DOCUMENTS

| | | | |
|---|---|---|---|
| 8,242,543 B2 | 8/2012 | Chandrasekaran et al. | |
| 8,829,657 B2 | 9/2014 | Kim et al. | |
| 8,956,951 B2 * | 2/2015 | Yokokawa | H01L 21/26506 438/455 |
| 9,153,565 B2 | 10/2015 | Chen et al. | |
| 10,014,340 B2 | 7/2018 | Yang et al. | |
| 10,109,487 B2 | 10/2018 | Kurz et al. | |
| 2003/0043565 A1 * | 3/2003 | Juang | H01L 23/3157 361/813 |

(Continued)

FOREIGN PATENT DOCUMENTS

| | | |
|---|---|---|
| CN | 103367397 A | 10/2013 |
| TW | 201133771 A | 10/2011 |

(Continued)

*Primary Examiner* — Nduka E Ojeh
(74) *Attorney, Agent, or Firm* — Slater Matsil, LLP

(57) ABSTRACT

Exemplary embodiments for redistribution layers of integrated circuits are disclosed. The redistribution layers of integrated circuits of the present disclosure include one or more arrays of conductive contacts that are configured and arranged to allow a bonding wave to displace air between the redistribution layers during bonding. This configuration and arrangement of the one or more arrays minimize discontinuities, such as pockets of air to provide an example, between the redistribution layers during the bonding.

20 Claims, 13 Drawing Sheets

(56) References Cited

U.S. PATENT DOCUMENTS

| | | | |
|---|---|---|---|
| 2003/0122243 A1* | 7/2003 | Lee | H01L 21/6835 257/700 |
| 2014/0199834 A1 | 7/2014 | Gu et al. | |
| 2014/0231887 A1 | 8/2014 | Chen et al. | |
| 2016/0155724 A1 | 6/2016 | Kim et al. | |
| 2016/0197055 A1 | 7/2016 | Yu et al. | |
| 2020/0075544 A1* | 3/2020 | Hong | H01L 24/94 |
| 2022/0013502 A1* | 1/2022 | Lee | H01L 24/06 |

FOREIGN PATENT DOCUMENTS

| | | |
|---|---|---|
| TW | 201351629 A | 12/2013 |
| TW | 201724488 A | 7/2017 |
| TW | 201739562 A | 11/2017 |
| WO | 2017140348 A1 | 8/2017 |

* cited by examiner

REDISTRIBUTION LAYER (RDL) LAYOUTS FOR INTEGRATED CIRCUITS

CROSS-REFERENCE TO RELATED APPLICATIONS

The present application claims the benefit of U.S. Provisional Patent Appl. No. 62/592,701, filed Nov. 30, 2017, which is incorporated herein by reference in its entirety.

BACKGROUND

The continued improvement of semiconductor fabrication processes has allowed manufacturers and designers to create a smaller and a more powerful electronic device. Semiconductor device fabrication has progressed from a ten (10) micrometer (μm) semiconductor fabrication process that was reached around 1971 to a twenty-two (22) nanometer (nm) semiconductor fabrication process that was reached around 2012. The semiconductor device fabrication is expected to further progress onto a five (5) nm semiconductor fabrication process around 2019. With each progression of the semiconductor fabrication process, components of the integrated circuits have become smaller to allow more components to be fabricated onto the semiconductor substrate. Multiple integrated circuits can be bonded together to form even more powerful electronic devices. However, with each progression of the semiconductor fabrication process, new challenges in bonding integrated circuits have been uncovered. One such new challenge relates to preventing pockets of air from forming between the integrated circuits during bonding.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1B:
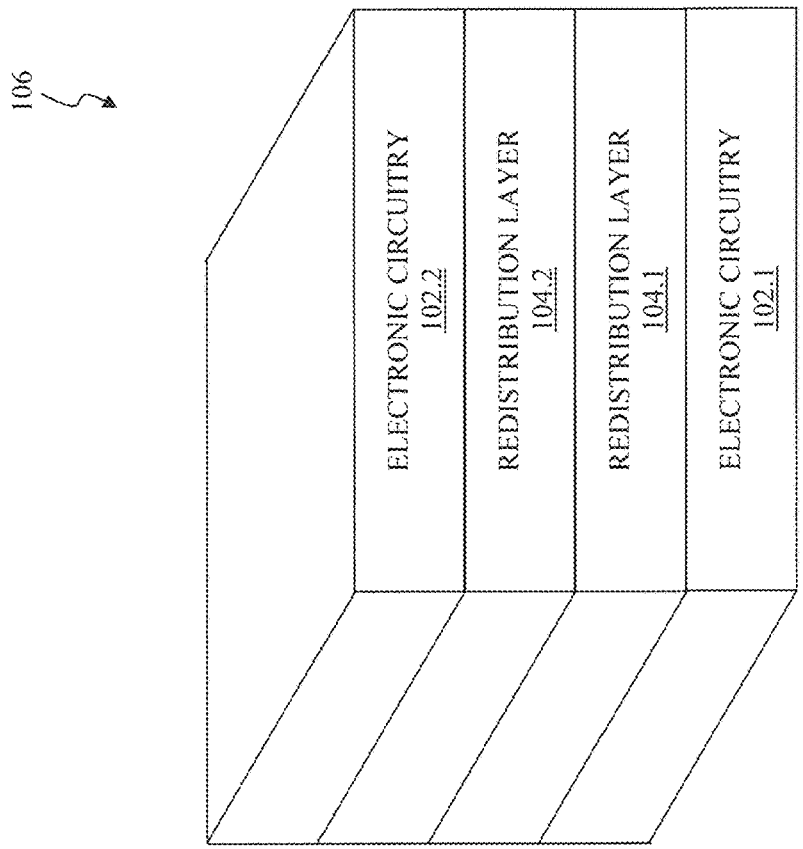
FIG. 1A and FIG. 1B illustrate exemplary integrated circuits according to exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition does not in itself dictate a relationship between the various embodiments and/or configurations discussed.

Overview

Exemplary embodiments for redistribution layers of integrated circuits are disclosed. The redistribution layers of integrated circuits of the present disclosure include one or more arrays of conductive contacts that are configured and arranged to allow a bonding wave to displace air between the redistribution layers during bonding. This configuration and arrangement of the one or more arrays minimize discontinuities, such as pockets of air to provide an example, between the redistribution layers during the bonding.

Exemplary Integrated Circuit

Figure 1A:
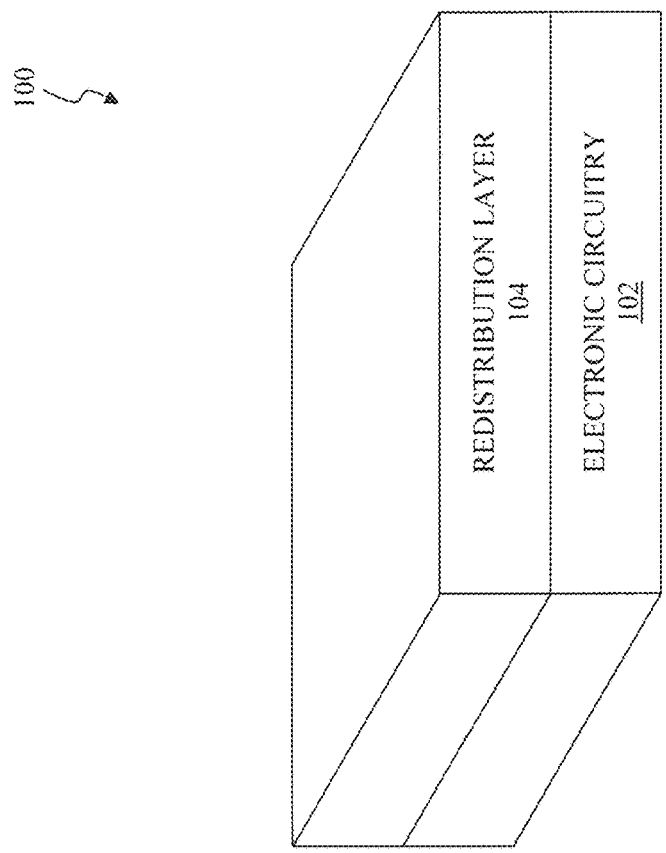

FIG. 1A and FIG. 1B illustrate exemplary integrated circuits according to exemplary embodiments of the present disclosure. As illustrated in FIG. 1A, an exemplary integrated circuit 100 includes electronic circuitry 102 and a redistribution layer 104. In the exemplary embodiment illustrated in FIG. 1A, the electronic circuitry 102 includes analog and/or digital circuitry situated within a semiconductor stack having one or more conductive layers, also referred to as metal layers, interdigitated with one or more non-conductive layers, also referred to as insulation layers, on a semiconductor substrate. However, one skilled in the relevant art(s) will recognize the electronic circuitry 102 can include one or more mechanical and/or electromechanical devices without departing from the spirit and scope of the present disclosure.

In the exemplary embodiment illustrated in FIG. 1A, the redistribution layer 104 represents a conductive layer from among the one or more conductive layers of the semiconductor stack which is utilized for electrically coupling the electronic circuitry 102 to other electrical, mechanical, and/or electromechanical devices. For example, the redistribution layer 104 can be used to electrically couple the electronic circuitry 102 to an integrated circuit package, such as a through-hole package, a surface mount package, a pin grid array package, a flat package, a small outline package, a chip-scale package, and/or a ball grid array to provide some examples. As another example and as illustrated in FIG. 1B, a first redistribution layer 104.1 from among a first semiconductor stack associated with first electronic circuitry 102.1 can be electrically and/or mechanically coupled to a second redistribution layer 104.2 from among a second semiconductor stack associated with second electronic circuitry 102.2 to electrically couple the first electronic circuitry 102.1 and the second electronic circuitry 102.2. In this exemplary embodiment, the first redistribution layer 104.1 is configured and arranged to be electrically and/or mechanically coupled to the second redistribution layer 104.2. In an exemplary embodiment, the first redistribution layer 104.1 is bonded to the second redistribution layer 104.2 using direct bonding, surface activated bonding, plasma activated bonding, anodic bonding, eutectic bonding, thermocompression bonding, reactive bonding, transient liquid phase diffusion bonding and/or any other well-known bonding technique which is apparent to those skilled in the relevant art(s) without departing from the spirit and scope of the present disclosure. In this exemplary embodiment, these aforementioned bonding techniques utilize a bonding wave to electrically and/or mechanically couple the first redistribution layer 104.1 and the second redistribution layer 104.2. As to be described in further detail below, the first redistribution layer 104.1 and the second redistribution layer 104.2 are configured and arranged to minimize discontinuities, such as pockets of air to provide an example, between the first redistribution layer 104.1 and the second redistribution layer 104.2 during the bonding of the first redistribution layer 104.1 and the second redistribution layer 104.2.

Exemplary Semiconductor Wafers

Figure 2B:
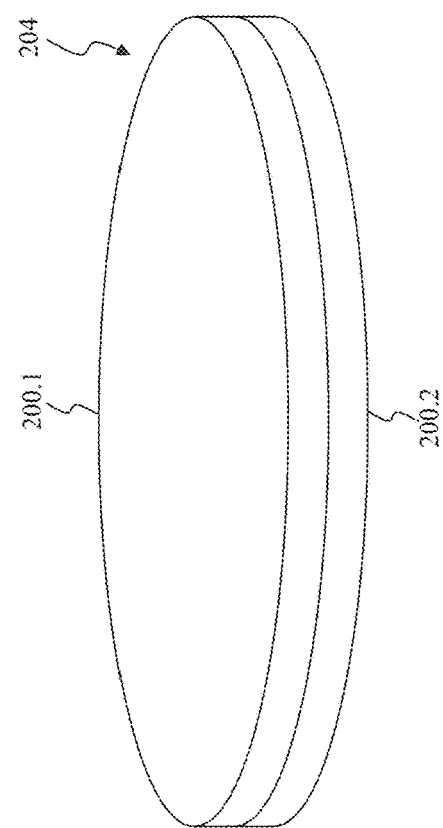
FIG. 2A and FIG. 2B illustrate exemplary semiconductor wafers including the exemplary integrated circuits according to exemplary embodiments of the present disclosure.
Figure 2A:
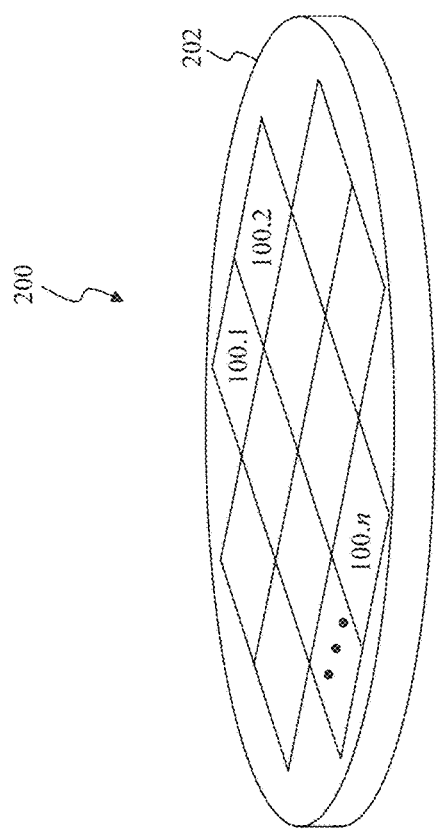

FIG. 2A and FIG. 2B illustrate exemplary semiconductor wafers including the exemplary integrated circuits according to exemplary embodiments of the present disclosure. A semiconductor device fabrication operation is utilized to manufacture multiple integrated circuits 100.1 through 100.$n$ onto a semiconductor substrate 202 to form a semiconductor wafer 200. In an exemplary embodiment, the semiconductor substrate 202 preferably includes a silicon crystal, but can include other materials, or combinations of materials, such as sapphire or any other suitable material that will be apparent to those skilled in the relevant art(s) without departing from the spirit and scope of the present disclosure. The semiconductor device fabrication operation uses a predetermined sequence of photographic and/or chemical processing operations to form the multiple integrated circuits 100.1 through 100.$n$ onto the semiconductor substrate 202. The predetermined sequence of photographic and/or chemical processing operations can include deposition, removal, patterning, and modification. The deposition is an operation used to grow, coat, or otherwise transfer a material onto the semiconductor substrate and can include physical vapor deposition (PVD), chemical vapor deposition (CVD), electrochemical deposition (ECD), and/or molecular beam epitaxy (MBE) to provide some examples. The removal is an operation to remove material from the semiconductor substrate and can include wet etching, dry etching, and/or chemical-mechanical planarization (CMP) to provide some examples. The patterning, often referred to as lithography, is an operation to shape or alter material of the semiconductor substrate to form various geometric shapes of the analog and/or digital circuitry for the electronic device. The modification of electrical properties is an operation to alter physical, electrical, and/or chemical properties of material of the semiconductor substrate, typically, by ion implantation. In an exemplary embodiment, a semiconductor foundry can utilize this fabrication flow to fabricate the analog and/or digital circuitry for the electronic device on the semiconductor substrate.

In the exemplary embodiment illustrated in FIG. 2A, the integrated circuits 100.1 through 100.$n$ are formed onto the semiconductor substrate 202 using a first series of fabrication operations, referred to as front-end-of-line processing, and a second series of fabrication operations, referred to as back-end-of-line processing. The front-end-of-line processing represents a first series of photographic and/or chemical processing operations to form corresponding electronic circuitry 102, as described above in FIG. 1A, of the multiple integrated circuits 100.1 through 100.$n$ onto the semiconductor substrate 202. In an exemplary embodiment, integrated circuits 100.1 through 100.$n$ may be similar and/or dissimilar to each other. The back-end-of-line processing represents a second series of photographic and/or chemical processing operations to form corresponding redistribution layers 104 of the multiple integrated circuits 100.1 through 100.$n$ to form the semiconductor wafer 200.

As illustrated in FIG. 2B, a first semiconductor wafer 200.1 is bonded to a second semiconductor wafer 200.2 to form a semiconductor wafer 204 to electrically and/or mechanically couple the redistribution layers 104 of the first semiconductor wafer 200.1 and the redistribution layers 104 of the second semiconductor wafer 202.1. This bonding can include direct bonding, surface activated bonding, plasma activated bonding, anodic bonding, eutectic bonding, thermocompression bonding, reactive bonding, transient liquid phase diffusion bonding and/or any other well-known bonding technique which is apparent to those skilled in the relevant art(s) without departing from the spirit and scope of the present disclosure. As to be described in further detail below, the redistribution layer 104.1 of the first semiconductor wafer 200.1 and the redistribution layer 104.2 of the second semiconductor wafer 202.1 are configured and arranged to minimize discontinuities, such as pockets of air to provide an example, between the redistribution layers 104 of the first semiconductor wafer 200.1 and the redistribution layers 104 of the second semiconductor wafer 202.1.

Exemplary Redistribution Layers of the Exemplary Integrated Circuits

Figure 3B:
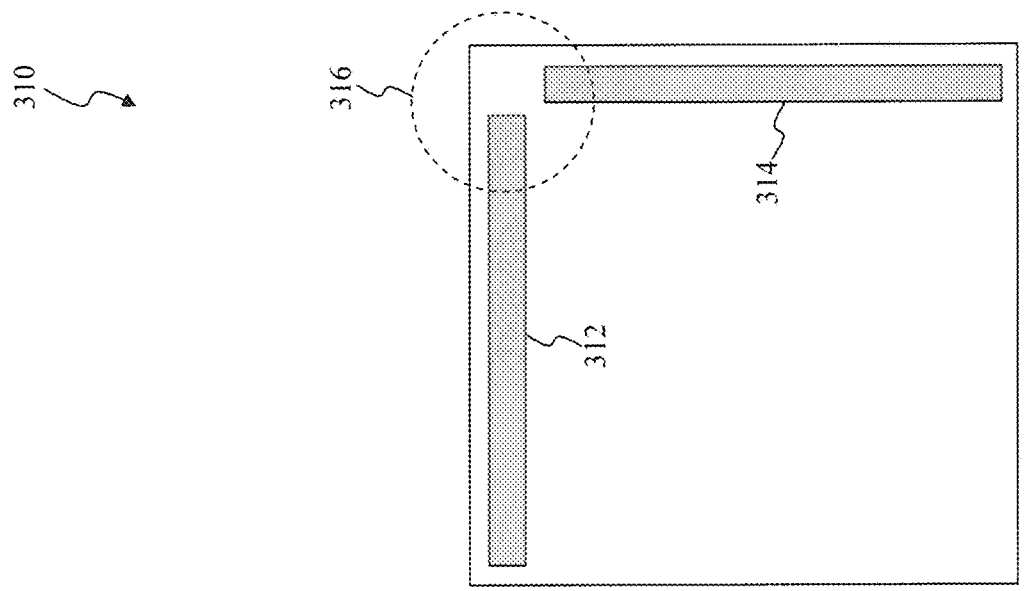
FIG. 3A through FIG. 3G illustrate exemplary redistribution layers of the exemplary integrated circuits according to exemplary embodiments of the present disclosure.
Figure 3A:
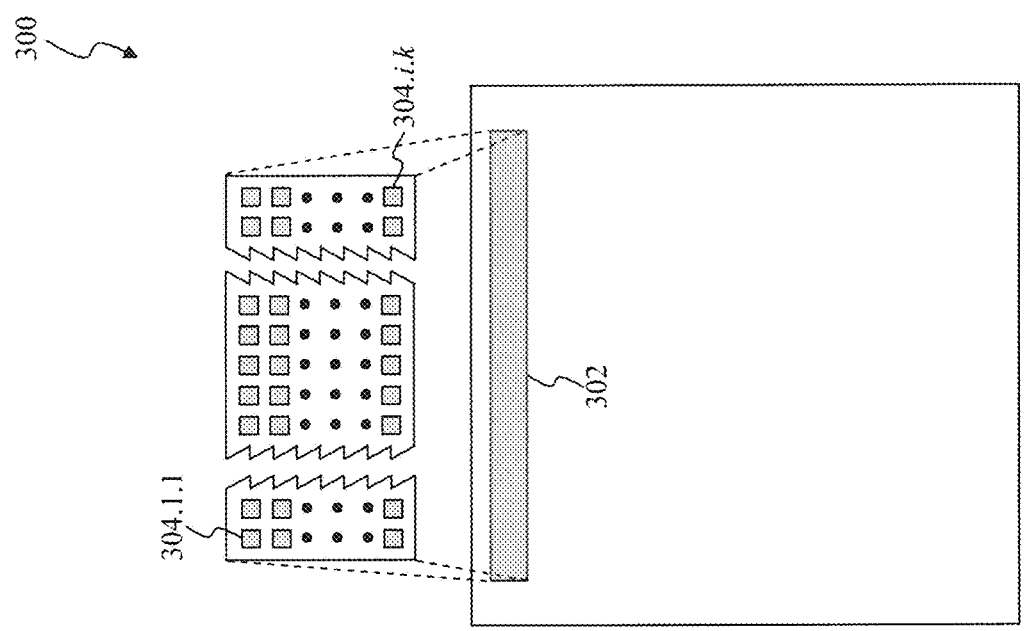
Figure 3D:
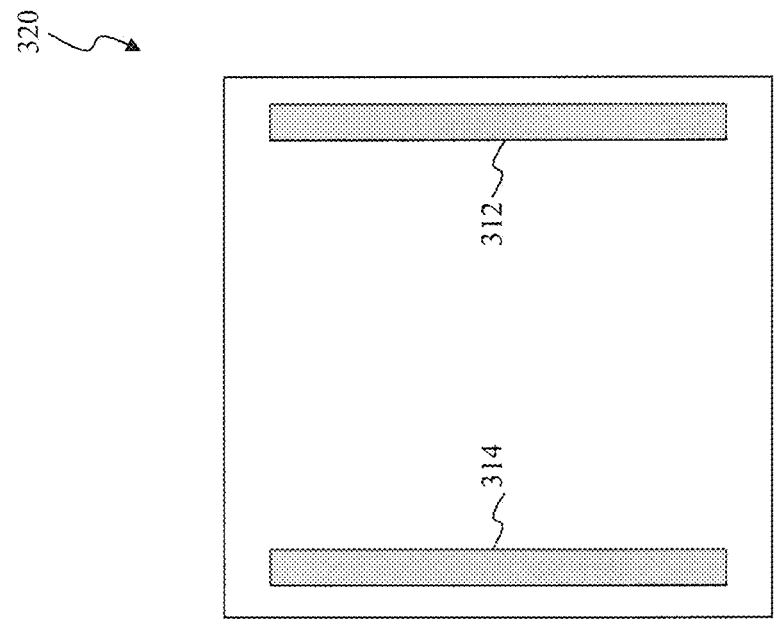
Figure 3C:
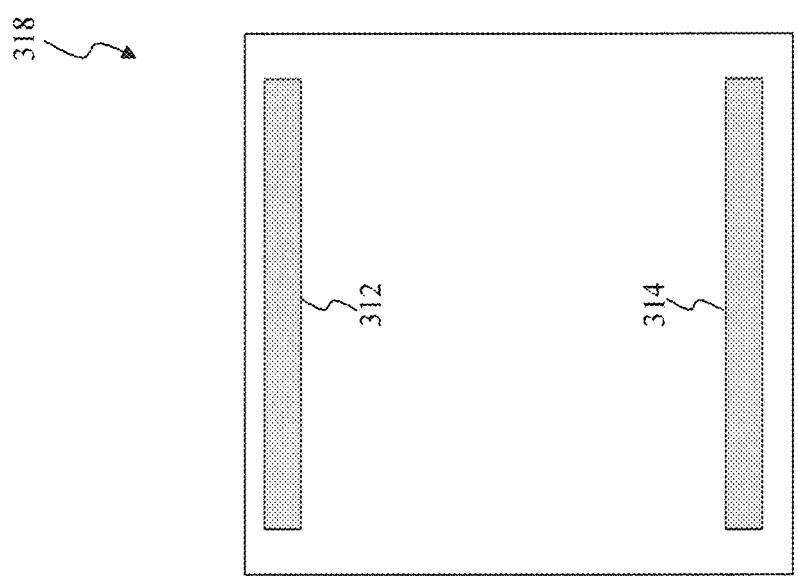
Figure 3F:
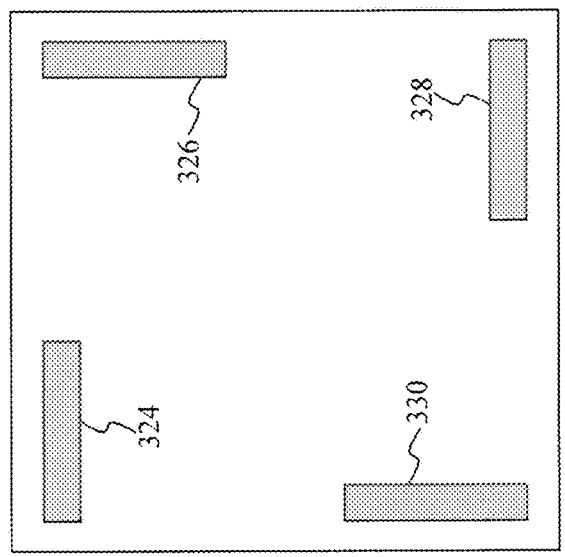
Figure 3E:
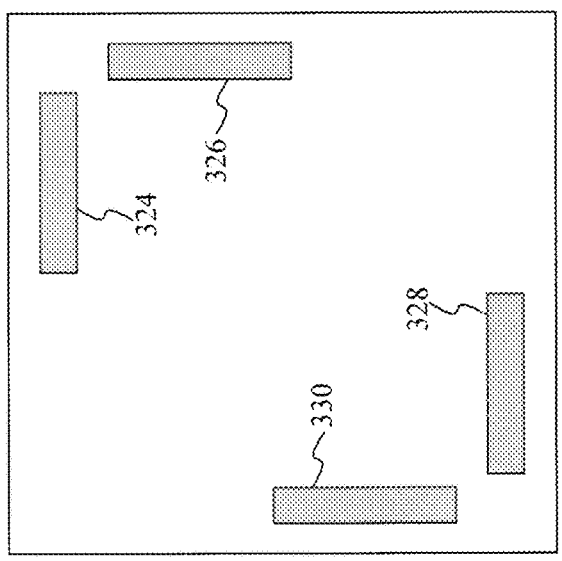
Figure 3G:
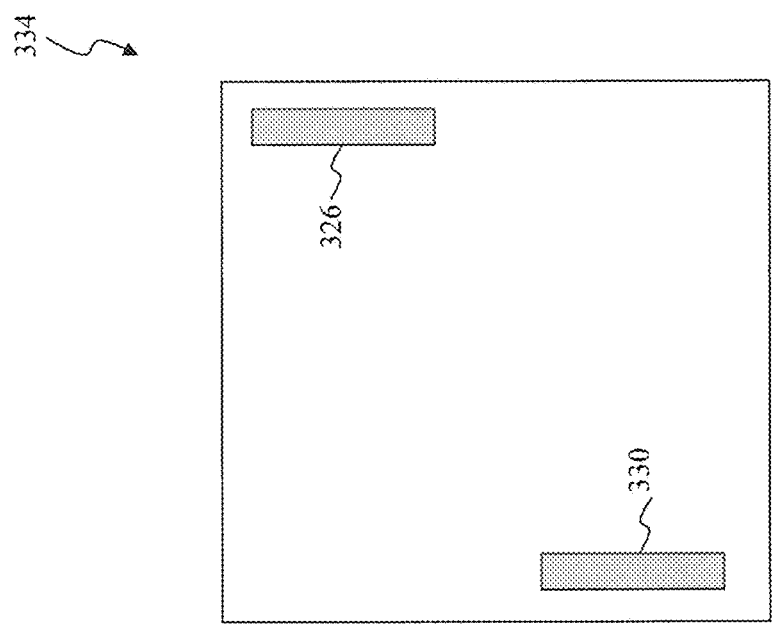

FIG. 3A through FIG. 3G illustrate exemplary redistribution layers of the exemplary integrated circuits according to exemplary embodiments of the present disclosure. A redistribution layer 318 as illustrated in FIG. 3A, a redistribution layer 310 as illustrated in FIG. 3B, a redistribution layer 318 as illustrated in FIG. 3C, a redistribution layer 320 as illustrated in FIG. 3D , a redistribution layer 322 as illustrated in FIG. 3E, a redistribution layer 332 as illustrated in FIG. 3F, and a redistribution layer 334 as illustrated in FIG. 3G each represents a conductive layer from among one or more conductive layers of a semiconductor stack of an integrated circuit, such as the integrated circuit 100 to provide an example. The redistribution layer 300, the redistribution layer 310, the redistribution layer 318, the redistribution layer 320, the redistribution layer 322, the redistribution layer 332, and/or the redistribution layer 334 can be utilized for electrically coupling the integrated circuit to other electrical, mechanical, and/or electromechanical devices. In the exemplary embodiment illustrated in FIG. 3A, the redistribution layer 300 includes an array of conductive contacts 302. As illustrated in FIG. 3A, the array of conductive contacts 302 extends along a first direction, such as an x-axis of a Cartesian coordinate system to provide an example, along a first side of the redistribution layer 300. Those skilled in the relevant art(s) will recognize the array of conductive contacts 302 can alternatively extend along a second direction, such as a y-axis of a Cartesian coordinate system to provide an example, along a second side of the redistribution layer 300 without departing from the spirit and scope of the present disclosure. In an exemplary embodiment, the array of conductive contacts 302 includes conductive contacts 304.1.1 through 304.$i.k$ arranged in a series of $i$ rows and $k$ columns to form an array. The conductive contacts 304.1.1 through 304.$i.k$ can include one or more conductive materials such as tungsten (W), aluminum (Al), copper (Cu), gold (Au), silver (Ag), or platinum (Pt) to provide some examples. However, the conductive contacts 304.1.1 through 304.$i.k$ can alternatively, or additional, include other materials, such as silicide, for example, nickel silicide (NiSi), sodium silicide ($Na_2Si$), magnesium silicide ($Mg_2Si$), platinum silicide (PtSi), titanium silicide ($TiSi_2$), tungsten silicide ($WSi_2$), or molybdenum disilicide ($MoSi_2$) to provide some examples, as will be recognize by those skilled in the relevant art(s) without departing from the spirit and scope of the present disclosure.

In the exemplary embodiment illustrated in FIG. 3A, the redistribution layer 300 can be bonded to other redistribution layers of other electrical, mechanical, and/or electromechanical devices using direct bonding, surface activated bonding, plasma activated bonding, anodic bonding, eutectic bonding, thermocompression bonding, reactive bonding, transient liquid phase diffusion bonding and/or any other well-known bonding technique which is apparent to those skilled in the relevant art(s) without departing from the spirit and scope of the present disclosure. In this exemplary embodiment, these bonding techniques listed above utilize a bonding wave to electrically and/or mechanically couple the redistribution layer 300 to other redistribution layers of other electrical, mechanical, and/or electromechanical devices. The configuration and arrangement of the array of conductive contacts 302 minimizes discontinuities, such as pockets of air to provide an example, between these redistribution layers. For example, the first array of conductive contacts 302 within the redistribution layer 30o allows the bonding wave to displace air between the redistribution layer 300 to other redistribution layers of other electrical, mechanical, and/or electromechanical devices during the bonding of these redistribution layers.

In the exemplary embodiment illustrated in FIG. 3B, the redistribution layer 310 includes a first array of conductive contacts 312 and a second array of conductive contacts 314. As illustrated in FIG. 3B, the first array of conductive contacts 312 extends along the first direction, such as the x-axis of the Cartesian coordinate system to provide an example, along a first side of the redistribution layer 310 and the second array of conductive contacts 314 extends along a second direction, such as a y-axis of the Cartesian coordinate system to provide an example, along a second side of the redistribution layer 310. In an exemplary embodiment, the first array of conductive contacts 312 and the second array of conductive contacts 314 include conductive contacts that are configured and arranged in a substantially similar manner as the array of conductive contacts 302 as described above in FIG. 3A. Those skilled in the relevant art(s) will recognize that other configurations and arrangements are possible for the first array of conductive contacts 312 and the second array of conductive contacts 314 without departing from the spirit and scope of the present disclosure. For example, the first array of conductive contacts 312 and the second array of conductive contacts 314 can extend along the first direction along a first side and a third side, respectively, of a redistribution layer 318 as illustrated in FIG. 3C. As another example, the first array of conductive contacts 312 and the second array of conductive contacts 314 can extend along the second direction along the second side and a fourth side, respectively, of a redistribution layer 320 as illustrated in FIG. 3D.

In the exemplary embodiment illustrated in FIG. 3B, the redistribution layer 310 can be bonded to other redistribution layers of other electrical, mechanical, and/or electromechanical devices in a substantially similar manner as the redistribution layer 300 as described above in FIG. 3B. In this exemplary embodiment, these bonding techniques listed above utilize a bonding wave to electrically and/or mechanically couple the redistribution layer 310 to other redistribution layers of other electrical, mechanical, and/or electromechanical devices. The configuration and arrangement of the first array of conductive contacts 312 and the second array of conductive contacts 314 minimize discontinuities, such as pockets of air to provide an example, between these redistribution layers. For example, the configuration and arrangement of the first array of conductive contacts 312 and the second array of conductive contacts 314 allows the bonding wave to displace air between the redistribution layer 310 and the other redistribution layers of other electrical, mechanical, and/or electromechanical devices during the bonding of these redistribution layers.

Additionally, in the exemplary embodiment illustrated in FIG. 3B, the redistribution layer 310 includes a separation, or exhaust pathway 316, between the first array of conductive contacts 312 and the second array of conductive contacts 314 to allow the air to be displaced during the bonding of the redistribution layer 310 and the other redistribution layers of other electrical, mechanical, and/or electromechanical devices during the bonding of these redistribution layers. In some situations, if the exhaust pathway 316 were not present, namely, the first array of conductive contacts 312 intersects or overlaps the second array of conductive contacts 314, one or more discontinuities can form approximate to an area within the redistribution layer 310 where the first array of conductive contacts 312 intersects the second array of conductive contacts 314. This intersection traps the air during the bonding of the redistribution layer 310 and the other redistribution layers of other electrical, mechanical, and/or electromechanical devices during the bonding of these redistribution layers forming the one or more discontinuities.

In the exemplary embodiment illustrated in FIG. 3E, the redistribution layer 322 includes a first array of conductive contacts 324, a second array of conductive contacts 326, a third array of conductive contacts 328, and a fourth array of conductive contacts 330. As illustrated in FIG. 3E, the first array of conductive contacts 324 and the third array of conductive contacts 328 extend along the first direction, such as the x-axis of the Cartesian coordinate system to provide an example, along a first side and a third side, respectively, of the redistribution layer 322. The second array of conductive contacts 326 and the fourth array of conductive contacts 330 extend along the second direction, such as the y-axis of the Cartesian coordinate system to provide an example, along a second side and a fourth side, respectively, of the redistribution layer 322. In an exemplary embodiment, lengths of the first array of conductive contacts 324 and the third array of conductive contacts 328 in the first direction are less than one-half a length of the redistribution layer 322 in the first direction. Similarly, in this exemplary embodiment, lengths of the second array of conductive contacts 326 and the fourth array of conductive contacts 330 in the second direction are less than one-half a length of the redistribution layer 322 in the second direction. In another exemplary embodiment, the first array of conductive contacts 324, the second array of conductive contacts 326, the third array of conductive contacts 328, and the fourth array of conductive contacts 330 include conductive contacts that are configured and arranged in a substantially similar manner as the array of conductive contacts 302 as described above in FIG. 3A. Those skilled in the relevant art(s) will recognize that other configurations and arrangements are possible for the first array of conductive contacts 324, the second array of conductive contacts 326, the third array of conductive contacts 328, and the fourth array of conductive contacts 330 without departing from the spirit and scope of the present disclosure. For example, the first array of conductive contacts 324 and the third array of conductive contacts 328 can be mirrored along an axis of the second direction, namely the y-axis of the Cartesian coordinate system to provide an example, as illustrated in FIG. 3F. Moreover, those skilled in the relevant art(s) will recognize the redistribution layer 322 need not include all of the first array of conductive contacts 324, the second array of conductive contacts 326, the third array of conductive contacts 328, and the fourth array of conductive contacts 330 without departing from the spirit and scope of the present disclosure. For example, the redistribution layer 334 includes the second array of conductive contacts and the fourth array of conductive contacts 330 as illustrated in FIG. 3G.

Furthermore, those skilled in the relevant arts will further recognize the redistribution layer 300 as illustrated in FIG. 3A, the redistribution layer 310 as illustrated in FIG. 3B, the redistribution layer 322 as illustrated in FIG. 3E, the redistribution layer 332 as illustrated in FIG. 3F, and/or the redistribution layer 334 as illustrated in FIG. 3G can be rotated, for example, by 90 degrees, 180 degrees, and/or 270 degrees, in a clockwise or counter-clockwise manner to form additional exemplary redistribution layers without departing from the spirit and scope of the present disclosure.

Exemplary Redistribution Layers of the Exemplary Semiconductor Wafers

Figure 4A:
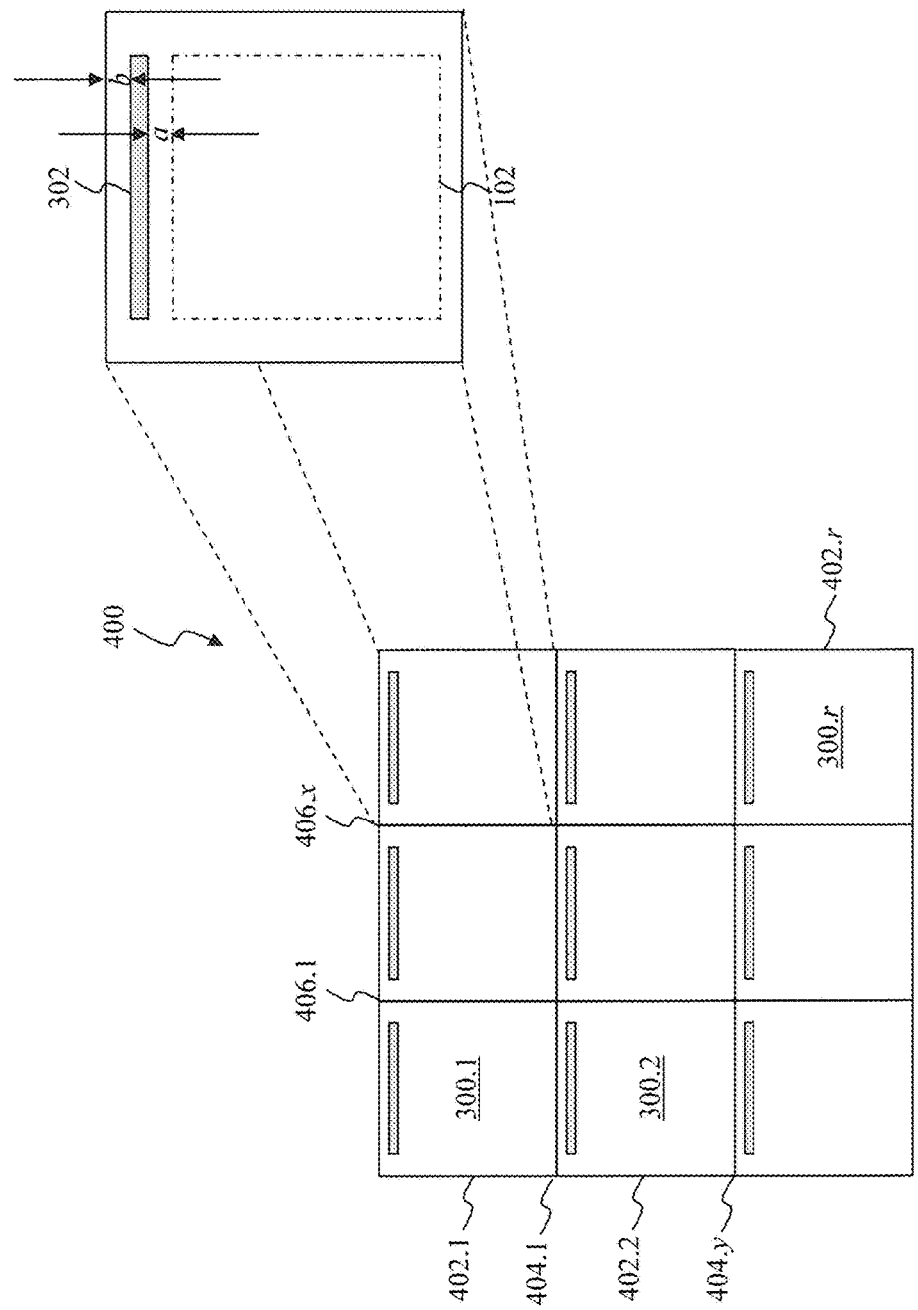
FIG. 4A through FIG. 4F illustrate exemplary redistribution layers for the exemplary semiconductor wafers according to exemplary embodiments of the present disclosure.
Figure 4B:
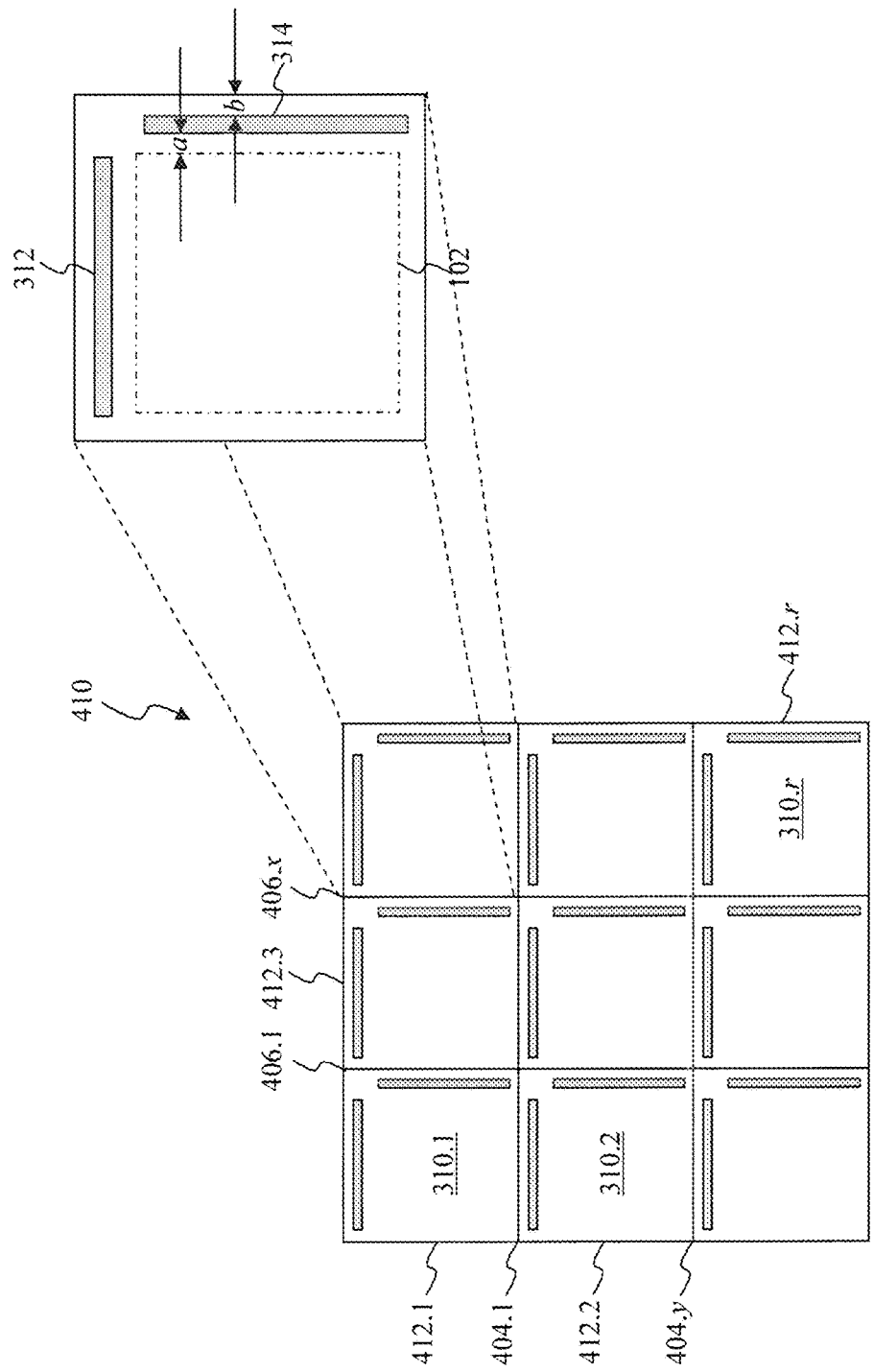
Figure 4C:
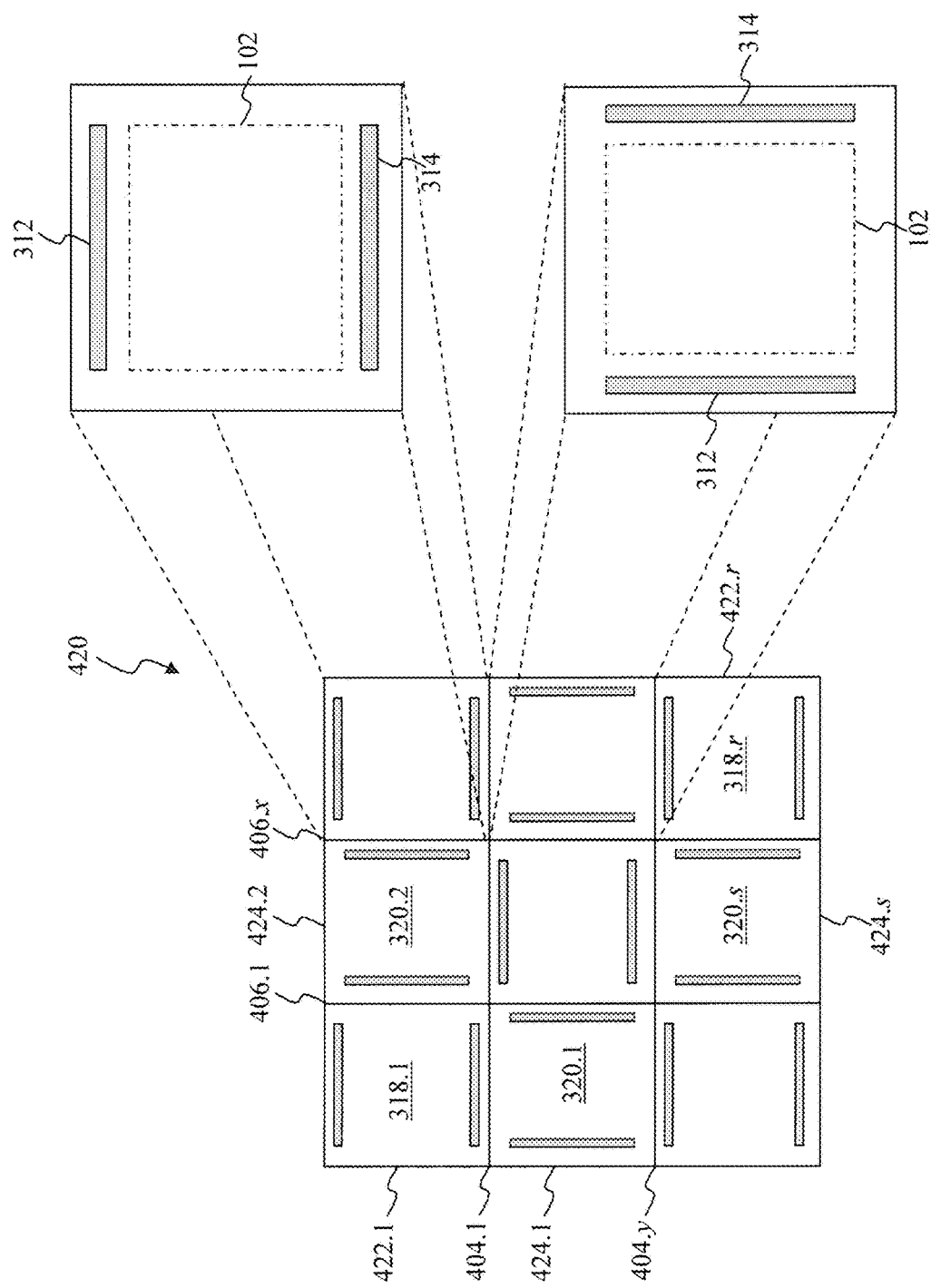
Figure 4D:
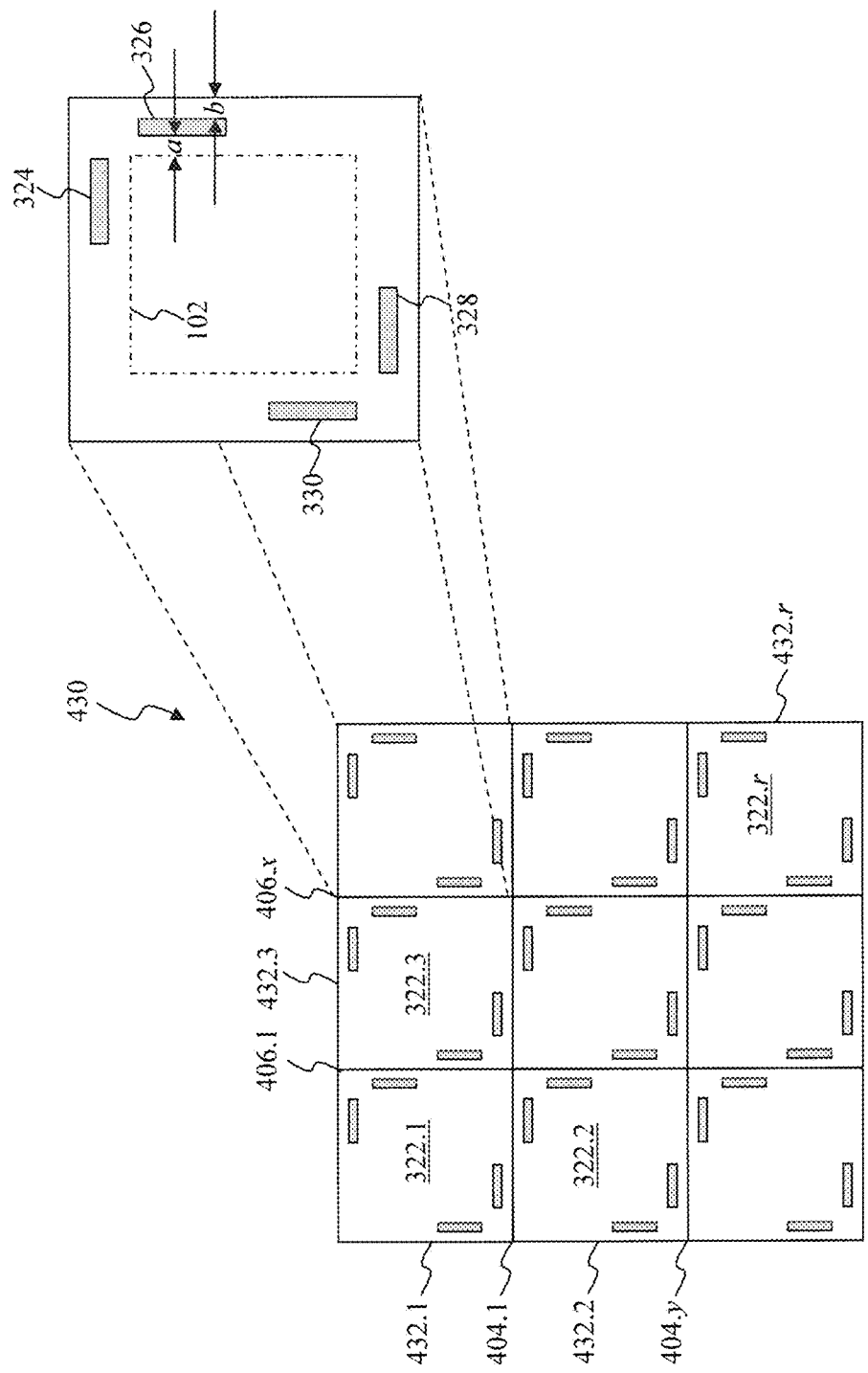
Figure 4E:
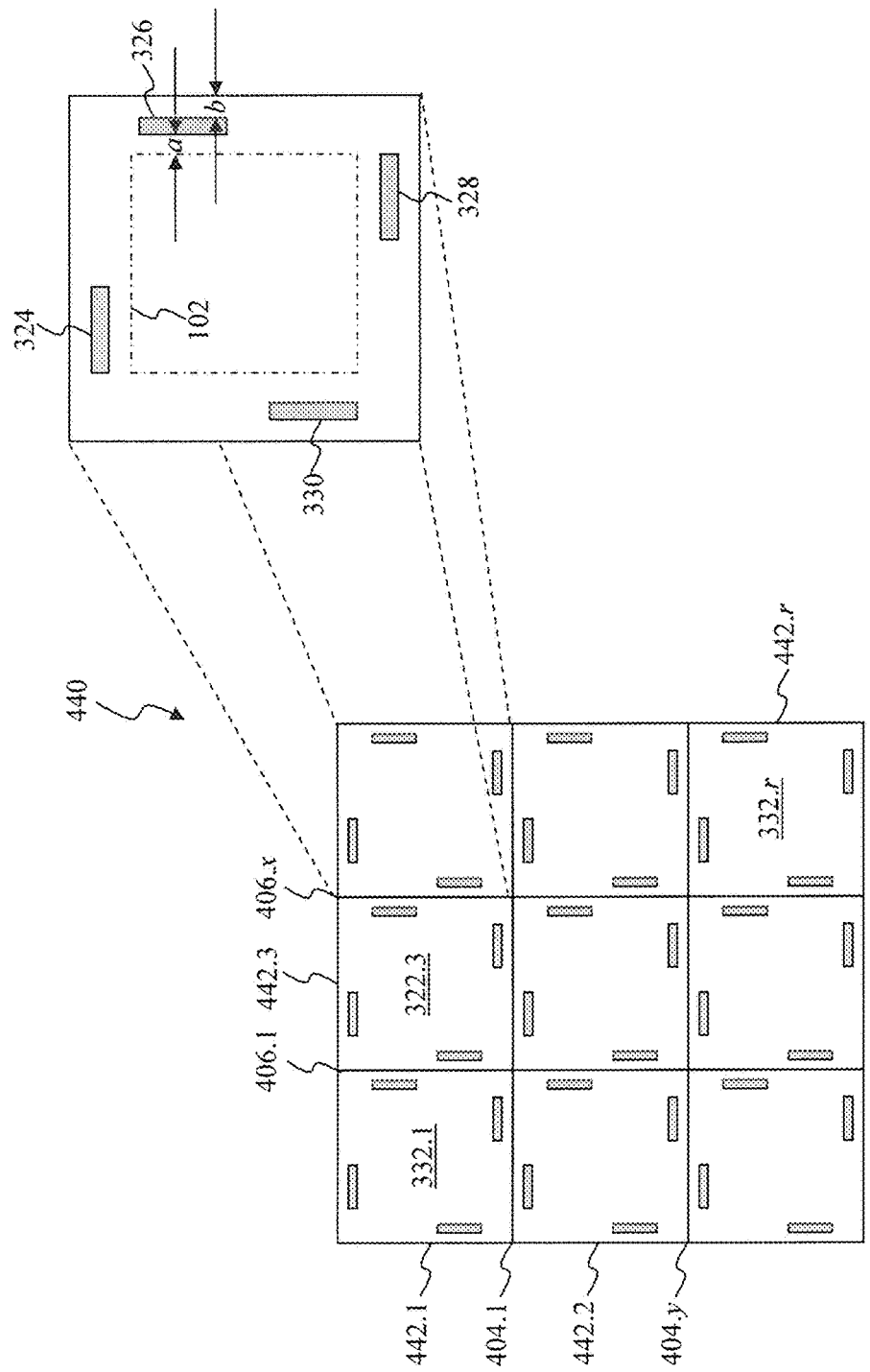
Figure 4F:
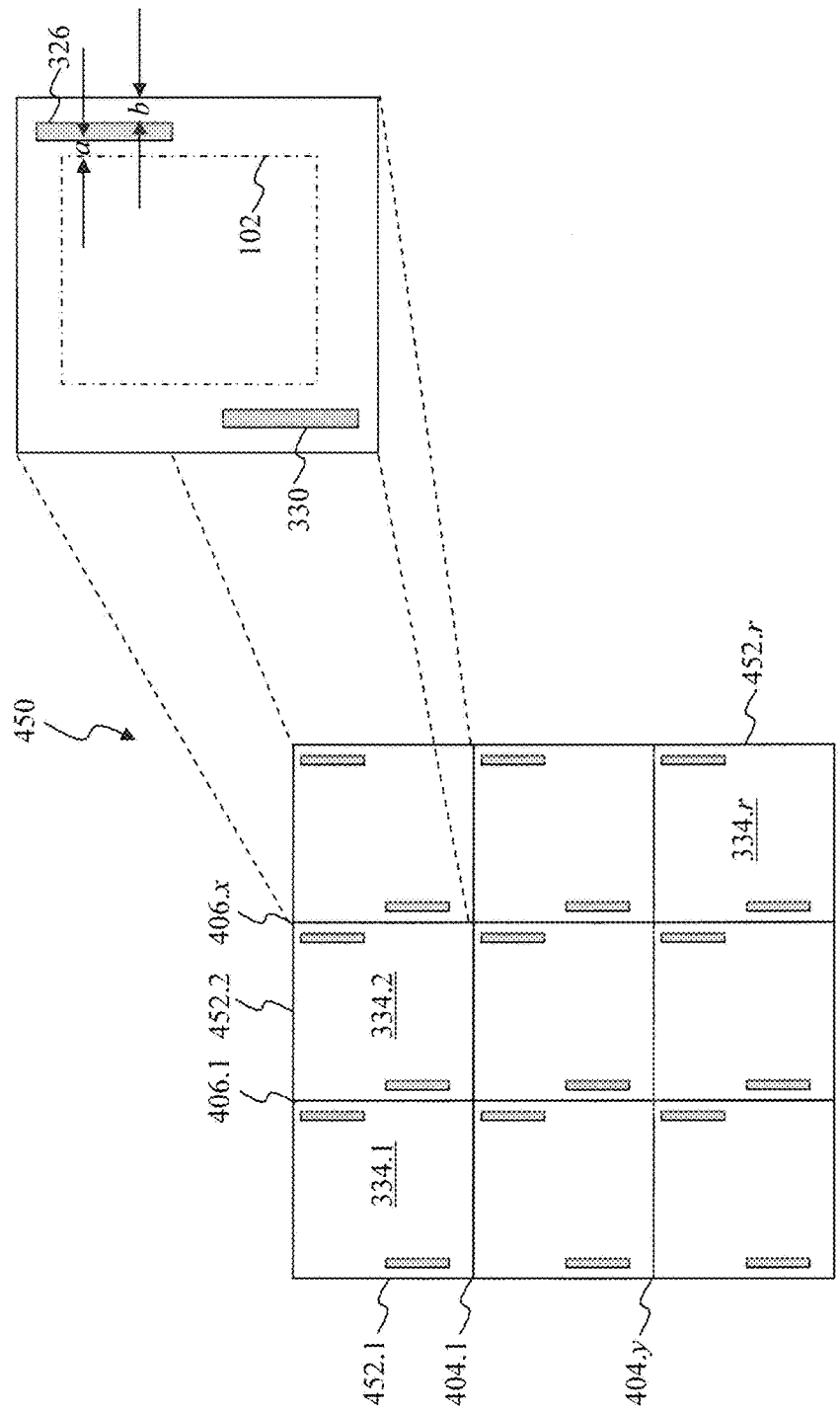

FIG. 4A through FIG. 4F illustrate exemplary semiconductor wafers having the exemplary redistribution layers according to exemplary embodiments of the present disclosure. A semiconductor wafer 400 as illustrated in FIG. 4A, a semiconductor wafer 410 as illustrated in FIG. 4B, a semiconductor wafer 420 as illustrated in FIG. 4C, a semiconductor wafer 430 as illustrated in FIG. 4D, a semiconductor wafer 440 as illustrated in FIG. 4E, and a semiconductor wafer 450 as illustrated in FIG. 4F includes multiple integrated circuits, such as the integrated circuits 100.1 through 100.n as described above in FIG. 2A, situated on a semiconductor wafer. The multiple integrated circuits include redistribution layers, such as the redistribution layer 300 as illustrated in FIG. 3A, the redistribution layer 310 as illustrated in FIG. 3B, the redistribution layer 322 as illustrated in FIG. 3E, the redistribution layer 332 as illustrated in FIG. 3F, and/or the redistribution layer 334 as illustrated in FIG. 3G to provide some examples, to electrically couple electronic circuitry 102 of the multiple integrated circuits to other electrical, mechanical, and/or electromechanical devices.

In the exemplary embodiment illustrated in FIG. 4A, the semiconductor wafer 400 includes integrated circuits 402.1 through 402.r. As illustrated in FIG. 4A, the integrated circuits 402.1 through 402.r include redistribution layers 300.1 through 300.r, each of the redistribution layers 300.1 through 300.r representing an exemplary embodiment of the redistribution layer 300 as described above in FIG. 3A. In the exemplary embodiment illustrated in FIG. 4A, the first array of conductive contacts 302 is separated or spaced apart from the electronic circuitry 102 within the semiconductor stack by a distance a. Similarly, the first array of conductive contacts 302 is separated or spaced apart from peripheries, or edges, of their corresponding redistribution layers 310.1 through 310.r by a distance b, such as approximately sixty-five micrometers (μm) to provide a non-limiting example. In an exemplary embodiment, the semiconductor wafer 400 includes horizontal rows of scribe lines 404.1 through 404.y and/or vertical columns of scribe lines 406.1 through 406.x. In this exemplary embodiment, the semiconductor wafer 400 can be cut along the horizontal rows of scribe lines 404.1 through 404.y and/or the vertical columns of scribe lines 406.1 through 406.x to separate the semiconductor wafer 400 into the integrated circuits 402.1 through 402.r. In the exemplary embodiment illustrated in FIG. 4A, at most one of the first array of conductive contacts 302 corresponding to one of the redistribution layers 300.1 through 300.r is adjacent to the horizontal rows of scribe lines 404.1 through 404.y at any location within the semiconductor wafer 400. For example, as illustrated in FIG. 4A, the first array of conductive contacts 302 corresponding to the redistribution layer 300.2 of the integrated circuit 402.2 is along the horizontal row of scribe line 404.1 between the integrated circuit 402.1 and the integrated circuit 402.2. This configuration and arrangement of the redistribution layers 300.1 through 300.r facilitates displacement of air during bonding of the semiconductor wafer 400 and other redistribution layers of other electrical, mechanical, and/or electromechanical devices during the bonding of these redistribution layers.

In the exemplary embodiment illustrated in FIG. 4B, the semiconductor wafer 410 includes integrated circuits 412.1 through 412.r. As illustrated in FIG. 4B, the integrated circuits 402.1 through 412.r include redistribution layers 310.1 through 310.r, each of the redistribution layers 310.1 through 310.r representing an exemplary embodiment of the redistribution layer 310 as described above in FIG. 3B. In the exemplary embodiment illustrated in FIG. 4B, the first array of conductive contacts 312 and the second array of conductive contacts 314 are separated or spaced apart from the electronic circuitry 102 within the semiconductor stack by a distance a. Similarly, the first array of conductive contacts 312 and the second array of conductive contacts 314 are separated or spaced apart from peripheries, or edges, of their corresponding redistribution layers 310.1 through 310.r by a distance b. In an exemplary embodiment, the semiconductor wafer 410 includes the horizontal rows of scribe lines 404.1 through 404.y and/or the vertical columns of scribe lines 406.1 through 406.x as described above in FIG. 4A. In the exemplary embodiment illustrated in FIG. 4B, at most one of the first array of conductive contacts 312 corresponding to one of the redistribution layers 310.1 through 310.r is adjacent to the horizontal rows of scribe lines 404.1 through 404.y at any location within the semiconductor wafer 410 and at most one of the second array of conductive contacts 314 corresponding to one of the redistribution layers 310.1 through 310.r is adjacent to the vertical columns of scribe lines 406.1 through 406.x at any location within the semiconductor wafer 410. For example, as illustrated in FIG. 4B, the first array of conductive contacts 312 corresponding to the redistribution layer 310.2 of the integrated circuit 412.2 is along the horizontal row of scribe line 404.1 between the integrated circuit 412.1 and the integrated circuit 412.2. As another example, as illustrated in FIG. 4B, the second array of conductive contacts 314 corresponding to the redistribution layer 310.1 of the integrated circuit 412.1 is along the vertical row of scribe lines 406.1 between the integrated circuit 412.1 and the integrated circuit 412.3. This configuration and arrangement of the redistribution layers 310.1 through 310.r facilitates displacement of air during bonding of the semiconductor wafer 410 and other redistribution layers of other electrical, mechanical, and/or electromechanical devices during the bonding of these redistribution layers.

In the exemplary embodiment illustrated in FIG. 4C, the semiconductor wafer 420 includes integrated circuits 422.1 through 422.r interdigitated with integrated circuits 424.1 through 424.s. As illustrated in FIG. 4C, the integrated circuits 422.1 through 422.r include redistribution layers 318.1 through 318.r, each of the redistribution layers 318.1 through 318.r representing an exemplary embodiment of the redistribution layer 318 as described above in FIG. 3. The integrated circuits 424.1 through 424.s include redistribution layers 320.1 through 320.s, each of the redistribution layers 320.1 through 320.s representing an exemplary embodiment of the redistribution layer 320 as described above in FIG. 3D. As illustrated in FIG. 4C, the redistribution layers 318.1 through 318.r and the redistribution layers 320.1 through 320.s are configured and arranged to optimize displacement of air during bonding of the semiconductor wafer 420 and other redistribution layers of other electrical, mechanical, and/or electromechanical devices. In the exemplary embodiment illustrated in FIG. 4C, the first array of conductive contacts 312 of the redistribution layers 318.1 through 318.r are situated along first sides, for example top sides, of the redistribution layers 318.1 through 318.r and the second array of conductive contacts 314 of the redistribution layers 318.1 through 318.r are situated along third sides, for example bottom sides, of the redistribution layers 318.1 through 318.r. Also in the exemplary embodiment illustrated in FIG. 4C, the first array of conductive contacts 312 of the redistribution layers 320.1 through 320.s are situated along second sides, for example right sides, of the redistribution layers 320.1 through 320.s and the second array of conductive contacts 314 of the redistribution layers 320.1 through 320.s r are situated along fourth sides, for example left sides, of the redistribution layers 320.1 through 320.s.

In an exemplary embodiment, the semiconductor wafer 420 includes the horizontal rows of scribe lines 404.1 through 404.y and/or the vertical columns of scribe lines 406.1 through 406.x as described above in FIG. 4A. In the exemplary embodiment illustrated in FIG. 4C, at most one of the first array of conductive contacts 312 and/or the second array of conductive contacts 314 corresponding to one of the redistribution layers 318.1 through 318.r is adjacent to the horizontal rows of scribe lines 404.1 through 404.y at any location within the semiconductor wafer 410 and at most one of the first array of conductive contacts 312 and/or the second array of conductive contacts 314 corresponding to one of the redistribution layers 320.1 through 320.s is adjacent to the vertical columns of scribe lines 406.1 through 406.x at any location within the semiconductor wafer 410. For example, as illustrated in FIG. 4C, the second array of conductive contacts 314 corresponding to the redistribution layer 318.1 of the integrated circuit 422.1 is along the horizontal row of scribe line 404.1 between the integrated circuit 422.1 and the integrated circuit 424.1. As another example, as illustrated in FIG. 4C, the first array of conductive contacts 312 corresponding to the redistribution layer 320.1 of the integrated circuit 424.2 is along the vertical row of scribe lines 406.1 between the integrated circuit 422.1 and the integrated circuit 424.2. This configuration and arrangement of the redistribution layers 320.1 through 320.r facilitates displacement of air during bonding of the semiconductor wafer 410 and other redistribution layers of other electrical, mechanical, and/or electromechanical devices during the bonding of these redistribution layers.

As illustrated in FIG. 4D, the semiconductor wafer 430 includes redistribution layers 322.1 through 322.r, each of the redistribution layers 322.1 through 322.r representing an exemplary embodiment of the redistribution layer 322 as described above in FIG. 3E. In the exemplary embodiment illustrated in FIG. 4D, the first array of conductive contacts 324, the second array of conductive contacts 326, the third array of conductive contacts 328, and the fourth array of conductive contacts 330 are separated or spaced apart from the electronic circuitry 102 within the semiconductor stack by a distance a. Similarly, the first array of conductive contacts 324, the second array of conductive contacts 326, the third array of conductive contacts 328, and the fourth array of conductive contacts 330 are separated or spaced apart from peripheries, or edges, of their corresponding redistribution layers 322.1 through 322.r by a distance b.

In an exemplary embodiment, the semiconductor wafer 430 includes the horizontal rows of scribe lines 404.1 through 404.y and/or the vertical columns of scribe lines 406.1 through 406.x as described above in FIG. 4A. In the exemplary embodiment illustrated in FIG. 4D, at most one of the first array of conductive contacts 324 and the third array of conductive contacts 328 corresponding to one of the redistribution layers 322.1 through 322.r is adjacent to the horizontal rows of scribe lines 404.1 through 404.y at any location within the semiconductor wafer 430 and at most one of the second array of conductive contacts 326 and the fourth array of conductive contacts 330 corresponding to one of the redistribution layers 322.1 through 322.r is adjacent to the vertical columns of scribe lines 406.1 through 406.x at any location within the semiconductor wafer 430. For example, as illustrated in FIG. 4D, the third array of conductive contacts 328 corresponding to the redistribution layer 322.1 of the integrated circuit 432.1 is along a first portion of the horizontal row of scribe line 404.1 between the integrated circuit 432.1 and the integrated circuit 432.2 and the first array of conductive contacts 324 corresponding to the redistribution layer 322.2 of the integrated circuit 432.2 is along a second portion of the horizontal row of scribe line 404.1 between the integrated circuit 432.1 and the integrated circuit 432.2. As another example, as illustrated in FIG. 4D, the second array of conductive contacts 326 corresponding to the redistribution layer 322.1 of the integrated circuit 432.1 is along a first portion of the vertical column of scribe line 406.1 between the integrated circuit 432.1 and the integrated circuit 432.3 and the fourth array of conductive contacts 330 corresponding to the redistribution layer 322.3 of the integrated circuit 432.3 is along a second portion of the vertical column of scribe line 406.1 between the integrated circuit 432.1 and the integrated circuit 432.3. This configuration and arrangement of the redistribution layers 322.1 through 322.r facilitates displacement of air during bonding of the semiconductor wafer 430 and other redistribution layers of other electrical, mechanical, and/or electromechanical devices during the bonding of these redistribution layers.

As illustrated in FIG. 4E, the semiconductor wafer 440 includes redistribution layers 332.1 through 332.r, each of the redistribution layers 332.1 through 332.r representing an exemplary embodiment of the redistribution layer 332 as described above in FIG. 3F. In the exemplary embodiment illustrated in FIG. 4E, the first array of conductive contacts 324, the second array of conductive contacts 326, the third array of conductive contacts 328, and the fourth array of conductive contacts 330 are separated or spaced apart from the electronic circuitry 102 within the semiconductor stack by a distance a. Similarly, the first array of conductive contacts 324, the second array of conductive contacts 326, the third array of conductive contacts 328, and the fourth array of conductive contacts 330 are separated or spaced apart from peripheries, or edges, of their corresponding redistribution layers 332.1 through 332.r by a distance b.

In an exemplary embodiment, the semiconductor wafer 440 includes the horizontal rows of scribe lines 404.1 through 404.y and/or the vertical columns of scribe lines 406.1 through 406.x as described above in FIG. 4A. In the exemplary embodiment illustrated in FIG. 4E, at most one of the first array of conductive contacts 324 and the third array of conductive contacts 328 corresponding to one of the redistribution layers 332.1 through 332.r is adjacent to the horizontal rows of scribe lines 404.1 through 404.y at any location within the semiconductor wafer 440 and at most one of the second array of conductive contacts 326 and the fourth array of conductive contacts 330 corresponding to one of the redistribution layers 332.1 through 332.*r* is adjacent to the vertical columns of scribe lines 406.1 through 406.*x* at any location within the semiconductor wafer 440. For example, as illustrated in FIG. 4E, the third array of conductive contacts 328 corresponding to the redistribution layer 332.1 of the integrated circuit 442.1 is along a first portion of the horizontal row of scribe line 404.1 between the integrated circuit 442.1 and the integrated circuit 432.2 and the first array of conductive contacts 324 corresponding to the redistribution layer 332.2 of the integrated circuit 432.2 is along a second portion of the horizontal row of scribe line 404.1 between the integrated circuit 442.1 and the integrated circuit 432.2. As another example, as illustrated in FIG. 4E, the second array of conductive contacts 326 corresponding to the redistribution layer 332.1 of the integrated circuit 442.1 is along a first portion of the vertical column of scribe line 406.1 between the integrated circuit 442.1 and the integrated circuit 432.3 and the fourth array of conductive contacts 330 corresponding to the redistribution layer 332.3 of the integrated circuit 432.3 is along a second portion of the vertical column of scribe line 406.1 between the integrated circuit 442.1 and the integrated circuit 432.3. This configuration and arrangement of the redistribution layers 332.1 through 332.*r* facilitates displacement of air during bonding of the semiconductor wafer 440 and other redistribution layers of other electrical, mechanical, and/or electromechanical devices during the bonding of these redistribution layers.

As illustrated in FIG. 4F, the semiconductor wafer 450 includes redistribution layers 334.1 through 334.r, each of the redistribution layers 334.1 through 334.*r* representing an exemplary embodiment of the redistribution layer $_{334}$ as described above in FIG. 3G. In the exemplary embodiment illustrated in FIG. 4F, the second array of conductive contacts 326, and the fourth array of conductive contacts $_{330}$ are separated or spaced apart from the electronic circuitry 102 within the semiconductor stack by a distance a. Similarly, the second array of conductive contacts 326, and the fourth array of conductive contacts 330 are separated or spaced apart from peripheries, or edges, of their corresponding redistribution layers 334.1 through 334.*r* by a distance b.

In an exemplary embodiment, the semiconductor wafer 450 includes the horizontal rows of scribe lines 404.1 through 404.*y* and/or the vertical columns of scribe lines 406.1 through 406.*x* as described above in FIG. 4A. In the exemplary embodiment illustrated in FIG. 4F, at most one of the second array of conductive contacts 326 and the fourth array of conductive contacts 330 corresponding to one of the redistribution layers 334.1 through 334.*r* is adjacent to the vertical columns of scribe lines 406.1 through 406.*x* at any location within the semiconductor wafer 450. For example, as illustrated in FIG. 4F, the second array of conductive contacts 326 corresponding to the redistribution layer 334.1 of the integrated circuit 452.1 is along a first portion of the vertical column of scribe line 406.1 between the integrated circuit 452.1 and the integrated circuit 452.2 and the fourth array of conductive contacts 330 corresponding to the redistribution layer 334.3 of the integrated circuit 452.2 is along a second portion of the vertical column of scribe line 406.1 between the integrated circuit 452.1 and the integrated circuit 452.2. This configuration and arrangement of the redistribution layers 334.1 through 334.*r* facilitates displacement of air during bonding of the semiconductor wafer 450 and other redistribution layers of other electrical, mechanical, and/or electromechanical devices during the bonding of these redistribution layers.

Exemplary Fabrication of the Exemplary Semiconductor Wafer

Figure 5:
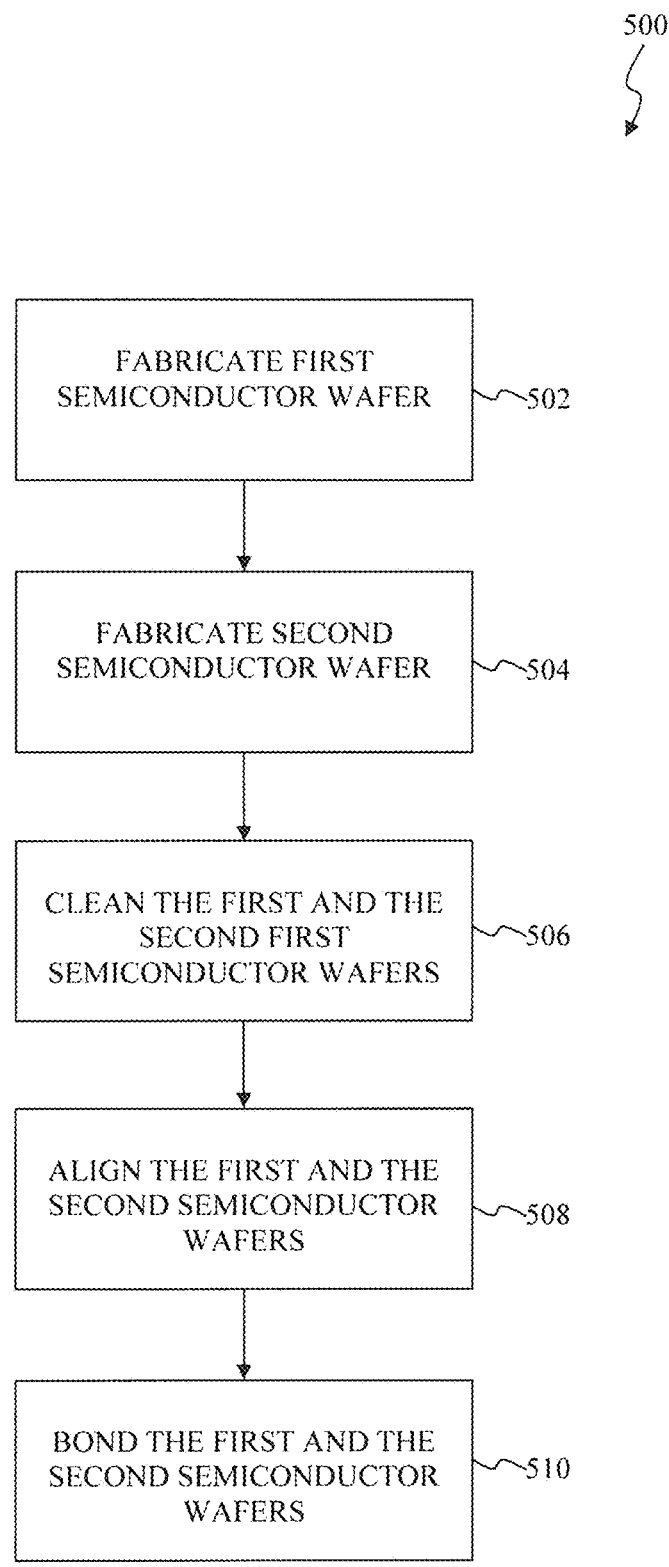
FIG. 5 illustrates a flowchart of exemplary operation for fabricating the exemplary semiconductor wafers including the exemplary integrated circuits according to an exemplary embodiment of the present disclosure.

FIG. 5 illustrates a flowchart of exemplary operation for fabricating the exemplary semiconductor wafers including the exemplary integrated circuits according to an exemplary embodiment of the present disclosure. The disclosure is not limited to this operational description. Rather, it will be apparent to ordinary persons skilled in the relevant art(s) that other operational control flows are within the scope and spirit of the present disclosure. The following discussion describes an exemplary operational control flow 500 for fabricating a semiconductor wafer, such as the semiconductor wafer 200 to provide an example.

At operation 502, the exemplary operational control flow 500 fabricates a first semiconductor wafer. The exemplary operational control flow 500 uses a first predetermined sequence of photographic and/or chemical processing operations to form multiple integrated circuits, such as the integrated circuits 100.1 through 100.*n* to provide an example, onto a semiconductor substrate, such as the semiconductor substrate 202 to provide an example, to form the first semiconductor wafer. The first predetermined sequence of photographic and/or chemical processing operations can include deposition, removal, patterning, and modification. The deposition is an operation used to grow, coat, or otherwise transfer a material onto the semiconductor substrate and can include physical vapor deposition (PVD), chemical vapor deposition (CVD), electrochemical deposition (ECD), and/or molecular beam epitaxy (MBE) to provide some examples. The removal is an operation to remove material from the semiconductor substrate and can include wet etching, dry etching, and/or chemical-mechanical planarization (CMP) to provide some examples. The patterning, often referred to as lithography, is an operation to shape or alter material of the semiconductor substrate to form various geometric shapes of the analog and/or digital circuitry for the electronic device. The modification of electrical properties is an operation to alter physical, electrical, and/or chemical properties of material of the semiconductor substrate, typically, by ion implantation.

At operation 504, the exemplary operational control flow 500 fabricates a second semiconductor wafer. The exemplary operational control flow 500 uses a second predetermined sequence of photographic and/or chemical processing operations to form multiple integrated circuits, such as the integrated circuits 100.1 through 100.*n* to provide an example, onto a semiconductor substrate, such as the semiconductor substrate 202 to provide an example, to form the second semiconductor wafer. The second predetermined sequence of photographic and/or chemical processing operations can include the deposition, the removal, the patterning, and the modification as described above in operation 502.

At operation 506, the exemplary operational control flow 500 cleans the first semiconductor wafer from operation 502 and the second semiconductor wafer from operation 504. The exemplary operational control flow 500 removes impurities from a first redistribution layer of the first semiconductor wafer from operation 502 and a second redistribution layer of the second semiconductor wafer from operation 504. The exemplary operational control flow 500 can utilize a dry cleaning, for example, plasma treatments, ultra-violet cleaning, and/or ozone cleaning to provide some examples, and/or a wet chemical cleaning procedure to remove the impurities.

At operation 508, the exemplary operational control flow 500 aligns the first semiconductor wafer from operation 502 and the second semiconductor wafer from operation 504. The exemplary operational control flow 500 aligns the first redistribution layer of the first semiconductor wafer from operation 502 and the second redistribution layer of the second semiconductor wafer from operation 504 for bonding. In an exemplary embodiment, the first redistribution layer of the first semiconductor wafer from operation 502 is a mirror, or substantial mirror, image of the second redistribution layer of the second semiconductor wafer from operation 504 to allow for bonding.

At operation 510, the exemplary operational control flow 500 bonds the first semiconductor wafer from operation 502 and the second semiconductor wafer from operation 504. The exemplary operational control flow 500 using direct bonding, surface activated bonding, plasma activated bonding, anodic bonding, eutectic bonding, thermocompression bonding, reactive bonding, transient liquid phase diffusion bonding and/or any other well-known bonding technique which is apparent to those skilled in the relevant art(s) without departing from the spirit and scope of the present disclosure to bond the first semiconductor wafer from operation 502 and the second semiconductor wafer from operation 504.

CONCLUSION

The foregoing Detailed Description discloses an integrated circuit. The integrated circuit includes electronic circuitry and a redistribution layer. The electronic circuitry is situated within a semiconductor stack having conductive layers interdigitated with a non-conductive layers situated on a semiconductor substrate. The redistribution layer is situated within a conductive layer from among the conductive layers of the semiconductor stack, the redistribution layer including a first array of conductive contacts extending along a first direction of the redistribution layer. The integrated circuit has been separated from integrated circuits situated on a semiconductor substrate along scribe lines. A second integrated circuit, including second electronic circuitry, is arranged on the semiconductor substrate to be adjacent to the integrated circuit along a first scribe line, the second integrated circuit including a second array of conductive contacts extending along the first direction. At most of one the first array of conductive contacts and the second array of conductive contacts is situated between the electronic circuitry and the second electronic circuitry along the first scribe line.

The foregoing Detailed Description also a semiconductor wafer. The semiconductor wafer includes a semiconductor substrate and integrated circuits. The integrated circuits are situated on the semiconductor substrate, the integrated circuits including redistribution layers having first arrays of conductive contacts and second arrays of conductive contacts. The first arrays of conductive contacts extends in a first direction along first sides their corresponding integrated circuits. The second arrays of conductive contacts extends in a second direction along second sides their corresponding integrated circuits.

The foregoing Detailed Description further discloses a method for fabricating an integrated circuit. The method includes fabricating a first semiconductor wafer, the first semiconductor wafer including first integrated circuits formed within a first semiconductor stack having first conductive layers interdigitated with first non-conductive layers situated on a semiconductor substrate, fabricating a second semiconductor wafer, the second semiconductor wafer including second integrated circuits and second redistribution layers situated on a semiconductor substrate, and bonding the first redistribution layers and the second redistribution layers to form the integrated circuit. The first integrated circuits includes first redistribution layers situated within the first conductive layers of the semiconductor stack, each redistribution layer from among the first retribution layers including a corresponding first array of conductive contacts from among first arrays of conductive contacts and a corresponding second array of conductive contacts from among second arrays of conductive contacts. The first arrays of conductive contacts extends in a first direction along first sides of their corresponding integrated circuits. The second arrays of conductive contacts extends in a second direction along a second sides their corresponding integrated circuits.

What is claimed is:

1. A method, comprising:
   fabricating a first semiconductor wafer comprising a first integrated circuit, a second integrated circuit and a first redistribution layer, the first integrated circuit comprising first electronic circuitry, the second integrated circuit comprising second electronic circuitry, the second integrated circuit being separated from the first integrated circuit by a scribe region, the first redistribution layer including a first array of conductive contacts on the first integrated circuit and a second array of conductive contacts on the second integrated circuit, the first array of conductive contacts and the second array of conductive contacts extending along a first direction, the first integrated circuit being adjoined with the second integrated circuit in a second direction substantially perpendicular to the first direction, and a first adjoin boundary being between the first integrated circuit and the second integrated circuit, wherein there are no conductive contacts between the first array of conductive contacts and the second array of conductive contacts; and
   fabricating a second semiconductor wafer comprising a second redistribution layer, the second redistribution layer is bonded with and electrically connected to the first redistribution layer; and
   after fabricating the first integrated circuit and the second integrated circuit, bonding the first semiconductor wafer and the second semiconductor wafer; and
   separating the first integrated circuit from the second integrated circuit along the scribe region.

2. The method of claim 1, further comprising cleaning the first semiconductor wafer and the second semiconductor wafer prior to bonding the first semiconductor wafer and the second semiconductor wafer.

3. The method of claim 1, wherein bonding the first semiconductor wafer and the second semiconductor wafer comprises:
   displacing air between the first and second redistribution layers during the bonding.

4. The method of claim 1, further comprising:
   aligning the first redistribution layer and the second redistribution layer prior to the bonding of the first and second redistribution layers.

5. A method, comprising:
   fabricating a first semiconductor wafer comprising a first integrated circuit, a second integrated circuit and a first redistribution layer, the first integrated circuit comprising first electronic circuitry, the second integrated circuit comprising second electronic circuitry, the first redistribution layer including a first array of conductive contacts on the first integrated circuit and a second array of conductive contacts on the second integrated circuit, wherein all portions of all conductive contacts of the first array of conductive contacts are located outside an outermost periphery of the first electronic circuitry in a top down view, the first array of conductive contacts and the second array of conductive contacts extending along a first direction, the first integrated circuit being adjoined with the second integrated circuit in a second direction substantially perpendicular to the first direction, wherein the first array of conductive contacts and the second array of conductive contacts are aligned with each other in the second direction, the first array of conductive contacts is formed between the first electronic circuitry and the second electronic circuitry, and the second electronic circuitry is formed under an area between the first array of conductive contacts and the second array of conductive contacts, wherein the conductive contacts of the first array of conductive contacts are the only conductive contacts between the first electronic circuitry and the second electronic circuitry; and
fabricating a second semiconductor wafer comprising a second redistribution layer;
bonding the first array of conductive contacts of the first redistribution layer to the second redistribution layer of the second semiconductor wafer; and
separating the first integrated circuit from the second integrated circuit along a scribe region.

6. The method of claim 5, further comprising cleaning the first semiconductor wafer and the second semiconductor wafer prior to bonding the first semiconductor wafer and the second semiconductor wafer.

7. The method of claim 5, wherein bonding the first semiconductor wafer and the second semiconductor wafer comprises:
displacing air between the first and second redistribution layers through operation of a bonding wave being applied to the first and second semiconductor wafers.

8. The method of claim 5, further comprising:
aligning the first redistribution layer and the second redistribution layer prior to the bonding of the first and second redistribution layers.

9. The method of claim 5, wherein the first array of conductive contacts and the second array of conductive contacts are spaced apart from each other by a distance, and the distance is greater than a dimension of the second electronic circuitry in the second direction.

10. The method of claim 5, wherein the first semiconductor wafer further comprises a third integrated circuit comprising third electronic circuitry, the first integrated circuit is adjoined with the third integrated circuit in the first direction,
wherein the first redistribution layer further includes a third array of conductive contacts on the first integrated circuit and a fourth array of conductive contacts on the third integrated circuit, the third array of conductive contacts and the fourth array of conductive contacts extend along the second direction,
wherein the third array of conductive contacts and the fourth array of conductive contacts are aligned with each other in the first direction, the first array of conductive contacts is formed between the first electronic circuitry and the third electronic circuitry, and the third electronic circuitry is formed under an area between the first array of conductive contacts and the third array of conductive contacts.

11. A method, comprising:
receiving a first integrated circuit comprising first electronic circuitry and a second integrated circuit comprising second electronic circuitry, the first electronic circuitry and second electronic circuitry being situated within a first semiconductor stack having a plurality of conductive layers interdigitated with a plurality of non-conductive layers situated on a first semiconductor substrate, wherein a first redistribution layer is situated within a conductive layer from among the plurality of conductive layers of the first semiconductor stack, the first redistribution layer including a first array of conductive contacts on the first integrated circuit and a second array of conductive contacts on the second integrated circuit, wherein the first integrated circuit includes a peripheral region free of electronic circuitry and further wherein the first array of conductive contacts is located entirely within the peripheral region when viewed in a top down direction, the first array of conductive contacts and the second array of conductive contacts extending along a first direction, the first integrated circuit being adjoined with the second integrated circuit in a second direction substantially perpendicular to the first direction, a first scribe region between the first integrated circuit and the second integrated circuit being substantially parallel with the first direction, wherein at most one of the first array of conductive contacts and the second array of conductive contacts is situated between the first electronic circuitry and the second electronic circuitry and extends along the first scribe region, wherein the first array of conductive contacts and the second array of conductive contacts are the only conductive contacts between the first electronic circuitry and the second electronic circuitry;
bonding a second semiconductor substrate to the first redistribution layer, wherein the second semiconductor substrate comprises a second semiconductor stack and a second redistribution layer on the second semiconductor stack; and
separating the first integrated circuit and the second integrated circuit by scribing along the first scribe region, after bonding the second semiconductor substrate to the first redistribution layer.

12. The method of claim 11, wherein the first array of conductive contacts is situated between the first electronic circuitry and the first scribe region, the first array of conductive contacts extends along the first scribe region, and the second electronic circuitry is between the second array of conductive contacts and the first scribe region.

13. The method of claim 11, wherein the first array of conductive contacts is situated between the first scribe region and the first electronic circuitry, and the first array of conductive contacts is separated from the first scribe region by a distance.

14. The method of claim 13, wherein the distance is approximately sixty-five micrometers (µm).

15. The method of claim 11, wherein the second array of conductive contacts is not situated between the first electronic circuitry and the second electronic circuitry.

16. The method of claim 11, further comprising a third integrated circuit comprising third electronic circuitry, wherein the first integrated circuit is adjoined with the third integrated circuit in the first direction, and wherein a second adjoin boundary between the first integrated circuit and the third integrated circuit is substantially parallel with the second direction, wherein the first redistribution layer further includes a third array of conductive contacts on the first integrated circuit and a fourth array of conductive contacts on the third integrated circuit, the third array of conductive contacts and the fourth array of conductive contacts extend along the second direction, and wherein at most of one the third array of conductive contacts and the fourth array of conductive contacts is between the first electronic circuitry and the third electronic circuitry.

17. The method of claim 16, wherein the third array of conductive contacts is situated between the first electronic circuitry and the second adjoin boundary, the third array of conductive contacts extends along the second adjoin boundary, and the third electronic circuitry is between the third array of conductive contacts and the fourth array of conductive contacts.

18. The method of claim 16, wherein the first array of conductive contacts, the second array of conductive contacts, the third array of conductive contacts and the fourth array of conductive contacts respectively include a plurality of conductive contacts configured and arranged in a plurality of rows and a plurality of columns.

19. The method of claim 11, wherein the first array of conductive contacts and the second array of conductive contacts respectively includes a plurality of conductive contacts configured and arranged in a plurality of rows and a plurality of columns.

20. The method of claim 16, wherein the fourth array of conductive contacts is not situated between the first electronic circuitry and the third electronic circuitry.

\* \* \* \* \*